United States Patent
Kealy

(10) Patent No.: US 10,416,235 B2
(45) Date of Patent: Sep. 17, 2019

(54) COMPONENT MONITORING

(71) Applicant: AIRBUS OPERATIONS LIMITED, Bristol (GB)

(72) Inventor: Paul Kealy, Bristol (GB)

(73) Assignee: Airbus Operations Limited, Bristol (GB)

( * ) Notice: Subject to any disclaimer, the term of this patent is extended or adjusted under 35 U.S.C. 154(b) by 0 days.

(21) Appl. No.: 15/722,175

(22) Filed: Oct. 2, 2017

(65) Prior Publication Data
US 2018/0095133 A1    Apr. 5, 2018

(30) Foreign Application Priority Data
Oct. 3, 2016    (GB) .................................. 1616805.6

(51) Int. Cl.
*G08B 21/00* (2006.01)
*G01R 31/34* (2006.01)
(Continued)

(52) U.S. Cl.
CPC ......... *G01R 31/343* (2013.01); *G01R 33/028* (2013.01); *G05B 23/0283* (2013.01);
(Continued)

(58) Field of Classification Search
CPC .... G01R 31/343; G01R 33/028; G01R 11/33; G01R 33/0283; H02K 11/25; H02K 11/33;
(Continued)

(56) References Cited

U.S. PATENT DOCUMENTS 6,297,742 B1    10/2001   Canada et al.
7,082,359 B2 *  7/2006   Breed .................. G07C 5/008
                                                701/31.5
(Continued)

FOREIGN PATENT DOCUMENTS

DE   10 2008 019 472    10/2009
EP    1 049 050         11/2000
(Continued)

OTHER PUBLICATIONS

European Search Report cited in EP 17194443.2, dated Jan. 31, 2018, 8 pages.

*Primary Examiner* — Kerri L McNally
*Assistant Examiner* — Thang D Tran
(74) *Attorney, Agent, or Firm* — Nixon & Vanderhye P.C.

(57) ABSTRACT

A component monitoring apparatus [100] including an input [110] to receive sensor data from a sensor arrangement [S1-S4]. The sensor data representative of a use of a respective component [105] during a monitoring interval. A memory [118] provided to store received sensor data and a life parameter associated with the component [105], an interface [126] provided to communicate with a remote device and a power cell [128] provided to power the apparatus [100]. The apparatus [100] arranged to: store in the memory [118] received sensor data, in response to a trigger, read the sensor data from the data memory [118] and transfer the sensor data to the remote device, and, in response to receipt of a data packet containing a life parameter associated with the usage of the component [100], store the life parameter to the memory [122].

21 Claims, 8 Drawing Sheets

(51) Int. Cl.
    *H02K 11/25*     (2016.01)
    *H02K 11/33*     (2016.01)
    *H02K 11/35*     (2016.01)
    *G01R 33/028*     (2006.01)
    *H02K 11/00*     (2016.01)
    *G07C 3/02*     (2006.01)
    *G07C 3/00*     (2006.01)
    *G05B 23/02*     (2006.01)
    *G01L 21/00*     (2006.01)

(52) U.S. Cl.
    CPC ................ *G07C 3/00* (2013.01); *G07C 3/02* (2013.01); *H02K 11/0094* (2013.01); *H02K 11/25* (2016.01); *H02K 11/33* (2016.01); *H02K 11/35* (2016.01); *G01L 21/00* (2013.01)

(58) Field of Classification Search
    CPC ...... H02K 11/35; H02K 11/0094; G07C 3/00; G07C 3/02; G01D 21/00; G05B 23/02
    USPC ........................................................ 340/635
    See application file for complete search history.

(56) References Cited

U.S. PATENT DOCUMENTS

| | | | | |
|---|---|---|---|---|
| 9,671,314 | B2* | 6/2017 | Followell | G01M 1/125 |
| 2003/0083794 | A1* | 5/2003 | Halm | B64D 47/00 |
| | | | | 701/29.4 |
| 2003/0137194 | A1* | 7/2003 | White | B60L 3/12 |
| | | | | 307/10.1 |
| 2003/0206111 | A1* | 11/2003 | Gao | G01R 31/008 |
| | | | | 340/635 |
| 2005/0228549 | A1* | 10/2005 | Stickling | H04B 15/00 |
| | | | | 701/3 |
| 2006/0281435 | A1* | 12/2006 | Shearer | G06K 19/0707 |
| | | | | 455/343.1 |
| 2008/0089087 | A1* | 4/2008 | Stoner | H04B 10/807 |
| | | | | 362/556 |
| 2008/0135615 | A1* | 6/2008 | Moran | G06K 19/07749 |
| | | | | 235/439 |
| 2009/0138871 | A1* | 5/2009 | Kimberly | G06F 8/61 |
| | | | | 717/173 |
| 2010/0057277 | A1* | 3/2010 | Goodrich | G07C 5/085 |
| | | | | 701/14 |
| 2010/0135263 | A1* | 6/2010 | Zakrzewski | G01D 21/00 |
| | | | | 370/338 |
| 2010/0231407 | A1* | 9/2010 | Carr | G06K 19/0723 |
| | | | | 340/691.1 |
| 2010/0315248 | A1* | 12/2010 | Townsend | G01B 7/16 |
| | | | | 340/635 |
| 2011/0054721 | A1* | 3/2011 | Goodrich | G05B 23/0283 |
| | | | | 701/14 |
| 2011/0126119 | A1* | 5/2011 | Young | G06F 3/048 |
| | | | | 715/744 |
| 2013/0027226 | A1* | 1/2013 | Cabos | G08G 5/0013 |
| | | | | 340/961 |
| 2013/0101276 | A1* | 4/2013 | Keller | G01C 11/02 |
| | | | | 396/55 |
| 2013/0197725 | A1* | 8/2013 | O'Dell | H04L 67/125 |
| | | | | 701/14 |
| 2013/0197739 | A1* | 8/2013 | Gallagher | B64F 5/60 |
| | | | | 701/31.5 |
| 2013/0255220 | A1* | 10/2013 | Mathews, Jr. | F02C 9/00 |
| | | | | 60/39.24 |
| 2014/0075506 | A1* | 3/2014 | Davis | H04L 67/12 |
| | | | | 726/3 |
| 2014/0164555 | A1* | 6/2014 | Followell | H04L 67/12 |
| | | | | 709/217 |
| 2014/0329521 | A1* | 11/2014 | Stauder | H04W 80/00 |
| | | | | 455/426.1 |
| 2015/0213706 | A1* | 7/2015 | Bai | G08B 21/182 |
| | | | | 340/635 |
| 2016/0055685 | A1* | 2/2016 | Lilly | G07C 5/0808 |
| | | | | 701/1 |
| 2016/0144983 | A1* | 5/2016 | Thuong | G01M 17/00 |
| | | | | 701/31.7 |
| 2016/0178464 | A1* | 6/2016 | Burns | F02C 3/10 |
| | | | | 73/112.01 |
| 2016/0204866 | A1* | 7/2016 | Boroson | H04B 10/1121 |
| | | | | 398/97 |
| 2016/0326904 | A1* | 11/2016 | Wu | G06K 19/07771 |
| 2016/0381558 | A1* | 12/2016 | Caulfield | H04W 16/14 |
| | | | | 726/1 |
| 2017/0017736 | A1* | 1/2017 | Beale | G05B 23/0283 |
| 2017/0073064 | A1* | 3/2017 | Isom | G01L 5/0009 |
| 2017/0099586 | A1* | 4/2017 | Corbin | H04W 4/08 |
| 2017/0106885 | A1* | 4/2017 | Singh | B61L 23/044 |
| 2017/0176588 | A1* | 6/2017 | Franceschini | G01S 7/352 |
| 2017/0187994 | A1* | 6/2017 | Tatourian | H04N 7/185 |
| 2017/0259942 | A1* | 9/2017 | Ziarno | B64D 45/00 |
| 2017/0261406 | A1* | 9/2017 | Dion | G01M 99/008 |
| 2017/0293517 | A1* | 10/2017 | Dion | G06F 11/0721 |

FOREIGN PATENT DOCUMENTS

| | | |
|---|---|---|
| GB | 2 225 125 | 5/1990 |
| GB | 2 428 844 | 2/2007 |
| WO | WO 2014/016232 | 1/2014 |

\* cited by examiner

COMPONENT MONITORING

RELATED APPLICATION

This application claims priority to United Kingdom (GB) patent application 1616805.6 filed Oct. 3, 2016, the entire contents of which is incorporated by reference.

TECHNICAL FIELD

The present invention relates to component monitoring and particularly, but not exclusively, to component monitoring, for example, for determining a component life parameter.

BACKGROUND

Some aircraft systems currently deploy on-board monitoring and diagnostics capabilities, for example, for monitoring engines and other important aircraft sub-systems. Data captured can be used in real-time. For example, data may be made available to a pilot via an avionics system in the form of cockpit monitoring and warning displays. In addition, or alternatively, data may be downloaded from an avionics system at a later date, for example, after an aircraft has landed and/or is being serviced, and used for analysis, prognostics and fault finding purposes.

Information relating to component usage and/or lifetime may be estimated and/or inferred from aircraft usage patterns. Doing so is not always reliable as different operators and pilots may place varying demands on the operation of an aircraft and environments in which aircraft can operate may vary significantly. It is typical, therefore, to adopt a conservative measure of component usage and/or lifetime to ensure appropriate service or replacement in good time before a component approaches its estimated or inferred service interval or lifetime. The challenge may be even greater if respective components are replaced prematurely, swapped between aircraft and/or are installed as second hand components. In such instances a degree of accuracy regarding component usage and/or lifetime can be assumed if associated usage records for aircraft on which the components have previously been used have been maintained reliably. However, if that is not the case, a component has to be thoroughly inspected and assessed before it can be installed and used.

SUMMARY

A first aspect of the present invention provides component monitoring apparatus, comprising: an input to receive sensor data from a sensor arrangement, the sensor data being representative of use of a component during a monitoring interval; memory to store received sensor data and a life parameter associated with the component; an interface to communicate with a remote device; and a power source to power the apparatus, wherein, the apparatus is arranged to: store in the memory received sensor data; in response to a trigger, read the sensor data from the data memory and transfer the sensor data to the remote device; and in response to receipt of a data packet, from the remote device, containing a life parameter associated with the usage of the component, store the life parameter to the memory.

The apparatus may comprise a sensor arrangement to generate the sensor data.

The apparatus may comprise volatile memory to store sensor data.

The apparatus may comprise non-volatile memory to store the life parameter. The non-volatile memory may comprise an RFID circuit and may be readable from and/or writable to using RFID signals. The RFID circuit may be powered by energy of the RFID signals.

The apparatus may be arranged to condition the sensor data after receipt thereof to reduce a respective storage overhead of the data representing the received sensor data.

The interface may comprise a wireless interface for communicating wirelessly with remote devices. The wireless interface may operate at a frequency of between 4.2 GHz and 4.4 GHz.

The memory may store a unique identifier of the apparatus. The apparatus may be arranged to respond to a trigger that contains an identifier that matches the unique identifier of the apparatus.

The apparatus may be mountable on and adapted for use in monitoring a vehicle component. The vehicle may be an aircraft.

According to a second aspect, the present invention provides a component package comprising: a component; and an apparatus of the aforementioned kind, which is fixedly attached to the component and arranged to sense at least one characteristic of the component and/or a respective environment during a monitoring interval thereof.

The component package may comprise a movable part, wherein the sensor arrangement is arranged to sense movement of the movable part during operation thereof and produce sensor data comprising movement data. The component package may instead comprise an immovable part, for example a load-bearing part.

The component package may comprise a rotatable part, wherein the sensor arrangement is arranged to sense rotation of the rotatable part during operation thereof and produce sensor data comprising rotation data.

The sensor arrangement may be arranged to sense at least one environmental parameter during operation of the component and produce environmental data. The sensor arrangement may be arranged to sense at least one of: temperature, relative humidity, salinity, pH level and airborne particulate concentration.

According to a third aspect the present invention provides a system for determining a component life parameter, comprising: an input to receive sensor data from an apparatus of the aforementioned kind; memory to store sensor data received from said apparatus; a processor to determine a life parameter using received sensor data and one or more respective component usage models; and an output to return a determined life measure to the apparatus from which the associated sensor data was received.

In the system the life parameter may comprise a total life consumed measure.

According to a fourth aspect, the present invention provides a method, comprising: sensing, at a component monitoring apparatus, at least one characteristic of a component, during a monitoring interval thereof, and producing sensor data representative of the at least one characteristic; transmitting the sensor data representative of the at least one characteristic to a remote device; computing using the transmitted sensor data and at least one associated operating model a life parameter of the component; storing the life parameter in a database record associated with the component; receiving, at the component monitoring device, the life parameter of the component; and storing the life parameter to a memory of the component.

Other aspects and embodiments will be apparent from the following description and accompanying drawings.

DETAILED DESCRIPTION

Figure 1:
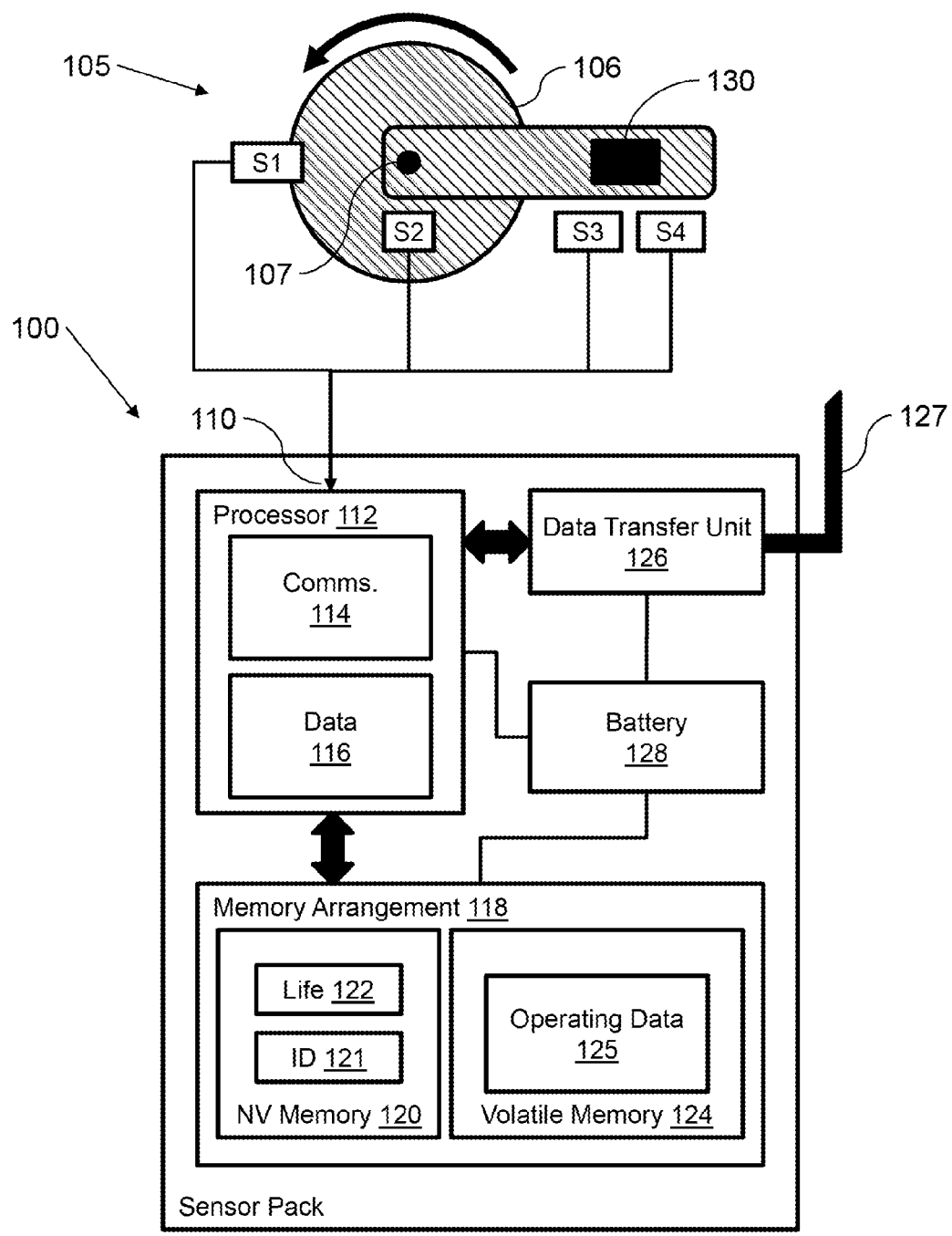
FIG. 1 is a schematic diagram of a component and sensing arrangement according to a first example herein.

The following disclosure relates to apparatus and processes for component monitoring and, based thereon, for the determination of one or more component life parameters. While the disclosure is applicable to aircraft components and the monitoring thereof, it is more broadly applicable to all kinds of components including those in or on any kind of machine or physical structure. For example, the disclosure without limitation may relate to components in or on all kinds of vehicles (such as aircraft, trains and cars), drilling rigs, wind turbines, buildings and bridges, and electrical equipment, such as telecommunications and/or computer equipment and systems.

Broadly-speaking, a component may have any one or more of electrical parts, mechanical moving parts, a structural purpose or a load-bearing purpose. Some components may be powered, for example, by electricity (generated or battery), wind, water, vibration, solar power, or in any other way, while other components may not be powered.

Component monitoring herein may take place during a monitoring interval. For a load-bearing structural component or a machine (for example, a machine that is in use and/or operates continuously), a monitoring interval may be a time period, such as an hour, a day, a week, or more, selected depending on the respective purpose, kind of use or operation of the respective component. A monitoring interval for a vehicle may, for example, be a selected time interval and/or may be distance dependent and/or may be determined by the start time and end time of one or more journeys. For an aircraft, for example, a monitoring interval may be selected in terms of a number of flights (including take-off and landing events) or an accumulated flight distance approaching or exceeding a certain level. For machines and vehicles in general, and in particular for an aircraft, a monitoring interval may be selected conveniently to coincide with a maintenance interval. Broadly-speaking, however, a monitoring interval, as used herein, may be defined in whichever way is appropriate and/or convenient for the respective component.

Component monitoring of the kind performed herein may use or be based on data collected by sensors. In general terms, a sensor, as referred to herein, may be any kind of sensor for monitoring the use or characteristics of or associated with a component over time. For example, sensors may include, without limitation, any one or more of sensors to sense movement, vibration levels or stress/load, sensors to sense temperature, humidity, air pressure, electrical sensors to sense voltage, current or electro-magnetic fields, and sensors to sense acidity, alkalinity, salinity, pH level or the like.

An example of a life parameter is an amount of component life used or consumed during a monitoring interval, which is referred to herein as Delta Life Consumed, or $\Delta_{CL}$. Another example of a life parameter is an amount of component life consumed over its operating life, which is referred to herein as Total Life Consumed, or $T_{CL}$. Other component life parameters may be determined, such as life remaining. The units used for $\Delta_{CL}$ and $T_{CL}$ may vary depending on the kind of component. In any event, the life parameter (for example 'consumed' or 'remaining') may have units that are determined by the nature of the component. For example, the units may relate to time, operating cycles, duty cycles, revolutions, reciprocations, operations, wear, fatigue, or to any other one or more measures that are suitable for expressing the life parameter of a respective component.

FIG. 1 illustrates a component monitoring apparatus comprising a first kind of sensor arrangement 100, referred to herein as a sensor pack, which may be used to monitor a component. The sensor pack 100 is associated with at least one sensor. In this example the sensor pack is associated with four sensors S1-S4, which are arranged to sense usage characteristics of a mechanical component 105. Usage characteristics may be physical operational characteristics of the component or environmental or other associated characteristics that influence operation and/or the operating life of the component. In this instance, the component 105 is illustrated as a mechanical device having a rotating part 106, rotating on an axle 107, which may drive the rotation of the rotating part. The exact details of the component are not important for the purposes of the present description. A first sensor (S1) is a rotation sensor of known kind, which is arranged to detect the rotation of the rotating part 106. A second sensor (S2) is a temperature sensor of known kind, which is arranged to detect the temperature at or very near to the axle 107. The sensor (S2) can be used to detect temperature increases due, for example, to increased friction due to axle wear. A third sensor (S3) is a second temperature sensor of known kind, which is arranged away from the axle 107 but in the vicinity of the component 105. The sensor (S3) can be used to detect variations in the ambient temperature around the component during a monitoring interval. A fourth sensor (S4) is a humidity sensor of known kind, which is arranged in the vicinity of the component 105. The sensor (S4) can be used to detect variations in the ambient humidity around the component during a monitoring interval.

According to FIG. 1, the sensor pack 100 includes an input 110 to receive sensor data from the sensors S1-S4. In this example the input 110 is coupled to a processor arrangement 112, which is arranged to control the operation of the sensor pack 100, as will be described. The processor arrangement 112 may comprise an appropriately programmed microcontroller of known kind, which includes a communications processing element 114 and a data processing element 116. The communications processing element 114 controls the communications between the sensor pack 100 and external devices and apparatus (not shown). The data processing element 116 may be arranged to process data that is generated by the sensor(s) S1-S4. Data from the sensors S1-S4, so-called sensor data, may be received directly from a sensor, for example if the sensor outputs digitally sampled data. Alternatively, sensor data may be received indirectly from the sensor if, for example, an output of the sensor comprises analogue signals, which have to be sampled and digitised by an intermediate analogue-to-digital circuit (not shown). In either event, the data processing element 116 may receive the sensor data and, for example, condition the data to reduce the respective storage overhead. In one example, the data processing element 116 may be arranged to sample, filter and/or compress the received sensor data by detecting and removing consecutive samples that have the same value (while introducing an indicator into the data to indicate that that has been done). In another example, the bit-length of the sampled sensor data may be reduced if fine-grained sampling is not required. In another example, some or all of the sampled data may be replaced by metadata. The metadata may be generated to describe the sampled data in quantitative and/or qualitative terms, it may indicate trends in the sampled data and/or represent any useful characteristics of the sampled data. In some examples, replacement of the sampled data with metadata reduces the amount of data and the attendant storage overhead thereof. There are many possible ways in which data may be reduced or compressed to reduce storage overheads, and the data processing element 116 may be arranged to perform one or more data reduction processes.

The processor arrangement 112 according to the present example is communicatively coupled to each of the sensors S1-S4 via appropriate circuitry and interfaces (not shown), the nature of which is determined by the form, location and operation of the respective sensors. In the present example, the sensors S1-S4 are electrically-coupled to the processor arrangement 112 via conductive wires. In other examples, one or more sensors may be coupled to the processor arrangement 112 via an optical interconnect. In other examples, one or more sensors may be coupled to the processor arrangement 112 via a wireless connection. The frequency band of wireless communication on an aircraft may be limited as specified by the International Telecommunication Union (ITU). In one example, the frequency band of the wireless communication is between 4.2 GHz and 4.4 GHz as specified for aircrafts in ITU. Combinations of any kind of appropriate and/or convenient connection may be deployed.

The sensor pack 100 according to the present example comprises a memory 118 for storing data. The memory 118 in the present example comprises a non-volatile (NV) memory element 120 and a volatile memory element 124. In this example, the processor arrangement 112 is coupled to the non-volatile 120 and volatile 124 memory elements and can read and write data, respectively, therefrom and thereto. In the present example, the NV memory element 120 is adapted or arranged to contain at least two items of data; a life parameter 122 and an identifier 121. In this example, the life parameter 122 is an indicator of the total life of the component that has been consumed by operation, TCL. The identifier 121 may be used to identify uniquely the sensor pack 100 in communications therewith. The volatile memory element 124 is adapted or arranged to contain operating data 125.

Also communicatively coupled to the processor arrangement 112 is an interface 126, referred to in this example as a data transfer unit (DTU). In this example the DTU 126 is shown to be a wireless device, including an antenna arrangement 127, to support wireless communications between the processor arrangement 112 and a remote device (not shown). In practice, the antenna arrangement 127 may be an external antenna or an internal, integrated antenna of known kind. In one example, wireless communication between the processor arrangement 112 and the remote device supported by the DTU is via a WiFi® network. In one example, the frequency band of the wireless communication is between 4.2 GHz and 4.4 GHz as specified for aircrafts by the ITU.

The sensor pack also comprises a power source 128, which in this example comprises a power cell. In this example the power cell 128 is shown to be a battery, for example a rechargeable battery. In other examples, the power cell 128 may be any other convenient kind of chargeable or replaceable energy cell, or any other kind of device to provide energy, including without limitation an energy harvesting device, for example, for harvesting energy from airflow, vibration or temperature gradient.

According to the present example, the sensor pack 100 is in a generally sealed or sealable unit, for example in a plastics or metal case. The nature and degree of sealing is commensurate with the intended location and/or operation of the component 105 and sensor pack 100. For instance, a far greater degree of sealing and other protection is required for a component on an aircraft that is exposed to the outside atmosphere during flight than for a component that is internal to, for example, a wing structure or undercarriage bay that is closed from the outside atmosphere during flight. According to the present example, the sensor pack 100 is fixedly mounted onto the component at a convenient location 130 on the component 105. The convenient location 130 will of course vary depending on the kind of component and its shape and configuration. The sensor pack 100 may be bonded with adhesive and/or attached by other means to the component 105, for example, by screwing or riveting a casing of the sensor pack 100 to the component 105. The type of mounting is determined such that the sensor pack and component will not become separated during typical use, maintenance and/or replacement of the component onto other vehicles, for example, if the component is being used as a replacement or such like. In this context the component 105 effectively comprises the sensor pack 100 and may be referred to as a component or component assembly comprising a sensor pack. A sensor pack should of course be replaceable if it is faulty of broken.

According to the present example, sensors, optionally, may or may not form an integral part of a sensor pack. For example, one or more sensors may necessarily be external of a sensor pack and communicatively connected to the sensor pack via a wire or by other means. This may be necessary if a sensor is measuring a feature of the operation of the respective component which necessarily spaces the sensor away from the convenient location where the sensor pack itself is mounted. An example of such a sensor may be a rotation sensor that needs to be proximal to a rotating element of a component. One or more other sensors may, for example, be located within a casing of the sensor pack that also houses the processing arrangement and other elements of the sensor pack. Examples of such internal sensors may be temperature and humidity sensors, respectively, for sensing ambient temperature and relative humidity.

In other examples, one or more of the sensors may not form a part of the sensor pack itself. For example, the sensor pack may be arranged to communicate with one or more sensors that are fixed to the vehicle in the vicinity of the component and/or sensor pack such that, for example, a replacement component and respective sensor pack for the vehicle may be arranged to obtain sensed data from the same, fixed sensors that reside on the vehicle in the vicinity of the component and sensor pack. The determination of whether one or more sensors is or are separated from the sensor pack is influenced by the nature of the sensors and the component being monitored.

In yet other examples, one or more sensors may be mounted in a separate casing, which is communicatively coupled by appropriate connections to the sensor pack. In this manner the sensors themselves could be replaced without having to replace the sensor pack.

Figure 2:
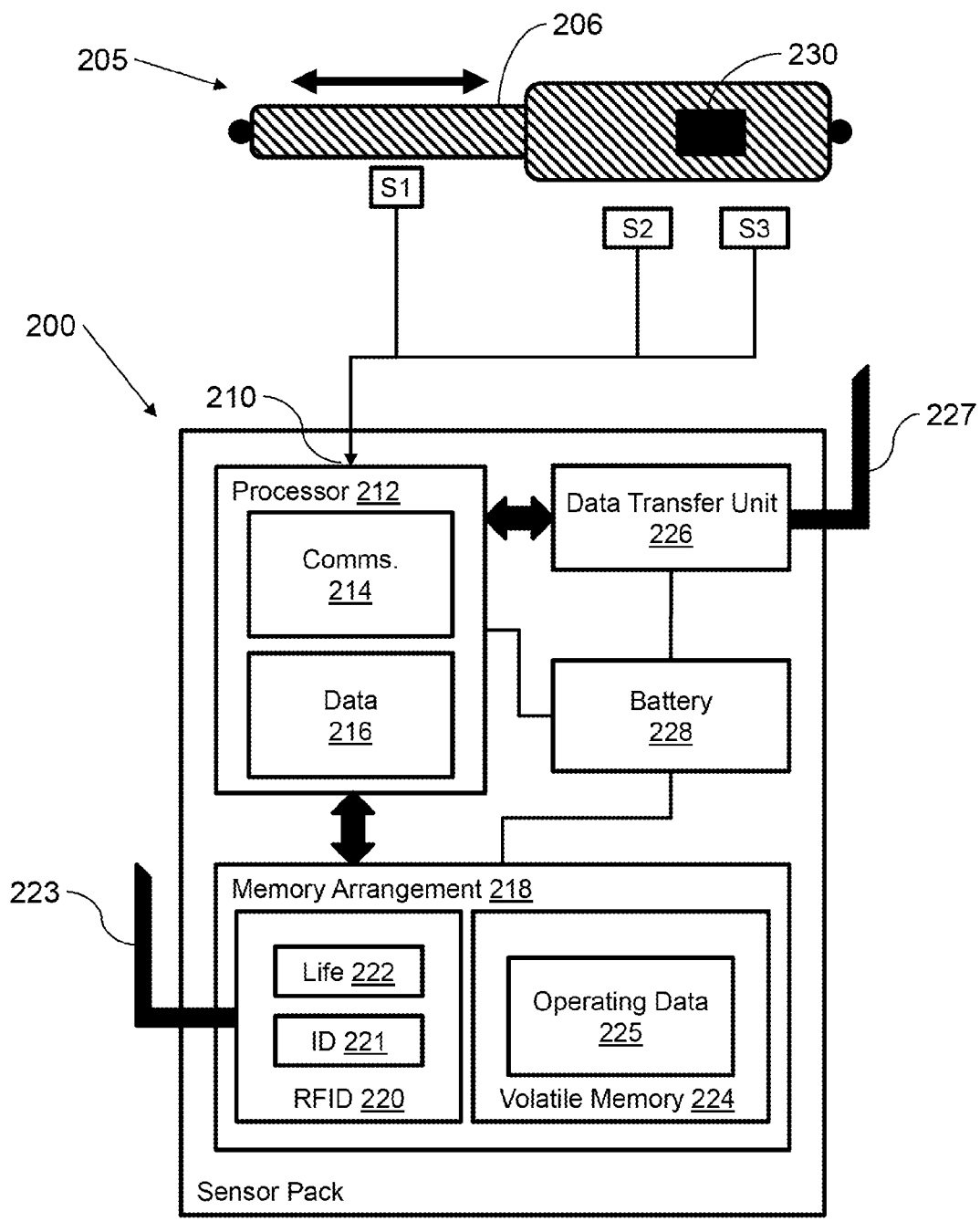
FIG. 2 is a schematic diagram of a component and sensing arrangement according to a second example herein.

A second kind of sensor pack 200 is shown in FIG. 2. In this example the sensor pack 200 is associated with three sensors S1-S3, which are arranged to sense usage characteristics of a component 205. In this instance, the component 205 is illustrated as a device comprising a hydraulic piston 206. The exact details of the component are not important for the purposes of the present description. A first sensor (S1) is a motion sensor of known kind, which is arranged to detect reciprocal motions of the piston 206. A second sensor (S2) is a temperature sensor of known kind, which is arranged in the vicinity of the piston 206. The sensor (S2) can be used to detect variations in the ambient temperature around the piston 206 when in operation. A third sensor (S3) is a dust particulate sensor of known kind, which is arranged in the vicinity of the piston. The sensor (S3) can be used to detect variations in the dust particulate concentration around the piston during a monitoring interval. Other sensors, for example strain sensors to measure the strain applied to the piston arrangement when in use, may in addition be deployed.

According to FIG. 2, the sensor pack 200 has a processor arrangement 212, a DTU 226 and a battery 228, which are similar to the equivalent components in the sensor pack of FIG. 1, and need not be described again.

In contrast to the sensor pack 100 of FIG. 1, however, the sensor pack 200 in FIG. 2 has a memory arrangement 218 comprising a volatile memory element 224 and a Radio-frequency Identification (RFID) memory element 220. The RFID memory element 220 comprises NV memory locations, which can be read by the processor arrangement 212 and, in addition, can be read from and written to by RFID signals via an RFID circuit (not shown) and antenna arrangement 223. In practice, the antenna arrangement 223 may be an external antenna or an internal, integrated antenna of known kind. The RFID memory element 220 may be passive, and writable to or readable from using energy transferred from an RFID signal, or it may be active and powered by the battery 228. In addition, the NV memory locations are adapted to contain a life value 222 and an identifier 221. Each value may be read by the processor arrangement 212.

Figure 3:
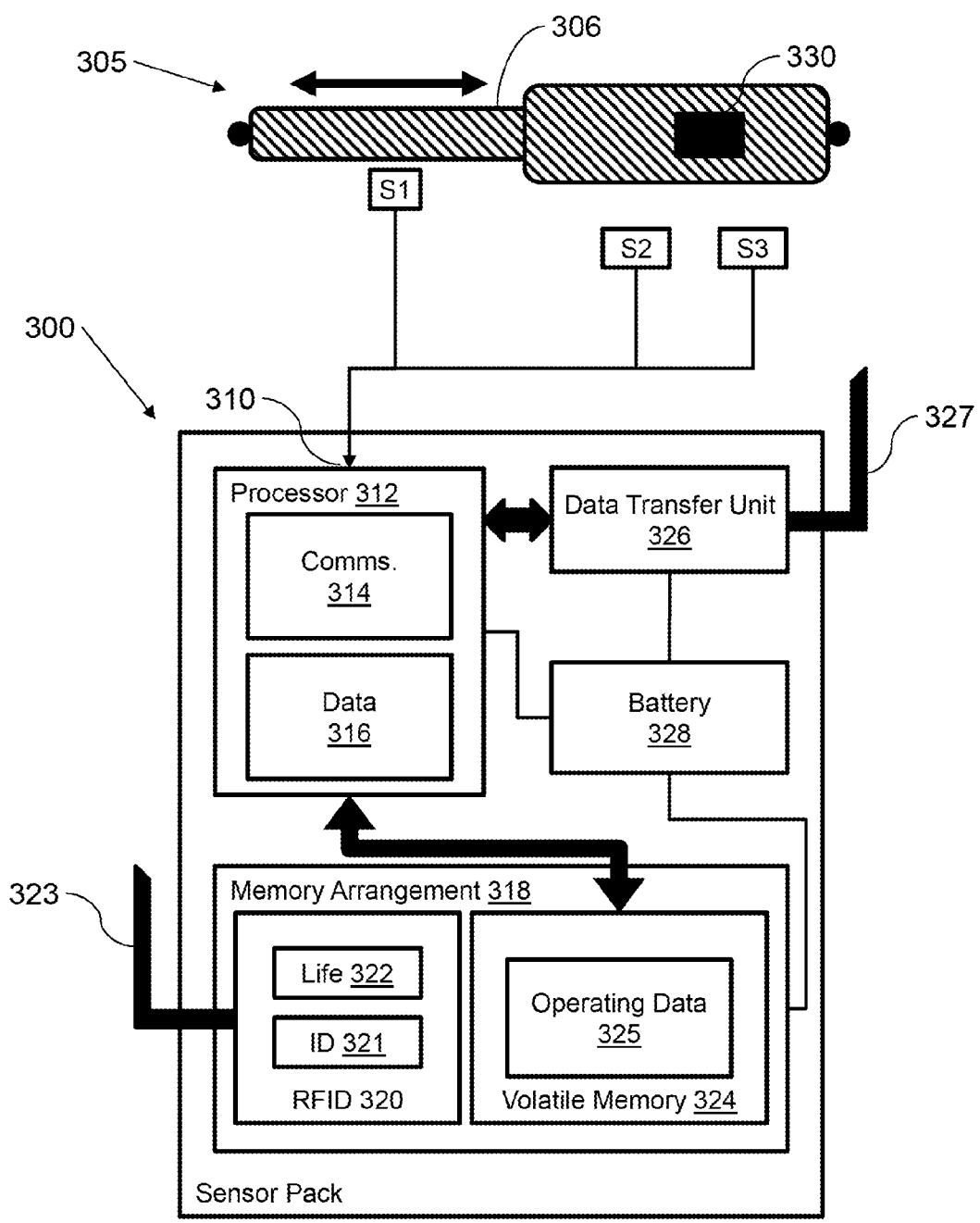
FIG. 3 is a schematic diagram of a component and sensing arrangement according to a third example herein.

A third kind of sensor pack 300 is shown in FIG. 3. The arrangement is broadly similar to the arrangement in FIG. 2 and common features will not be described again.

In contrast to the sensor pack of FIG. 2, however, the sensor pack 300 in FIG. 3 has a memory arrangement 318 comprising a volatile memory element 324 and an RFID memory element 320, wherein the processor arrangement 318 is communicatively coupled to the volatile memory element 324 and not to the RFID memory element 320. The RFID memory element 320 comprises non-volatile memory locations, which can be read from and written to only by RFID signals via an RFID antenna arrangement 323. The NV memory locations are again adapted to contain two items of data; a life value 322 and an identifier 321. In this example, the identifier may not be readable by the processor arrangement 312 and, instead, may be loaded to the processor arrangement by other means. For example, a copy of the identifier 321 may be stored in other NV memory (not shown) accessible to the processor arrangement 312 during manufacture or initial set-up.

Figure 4:
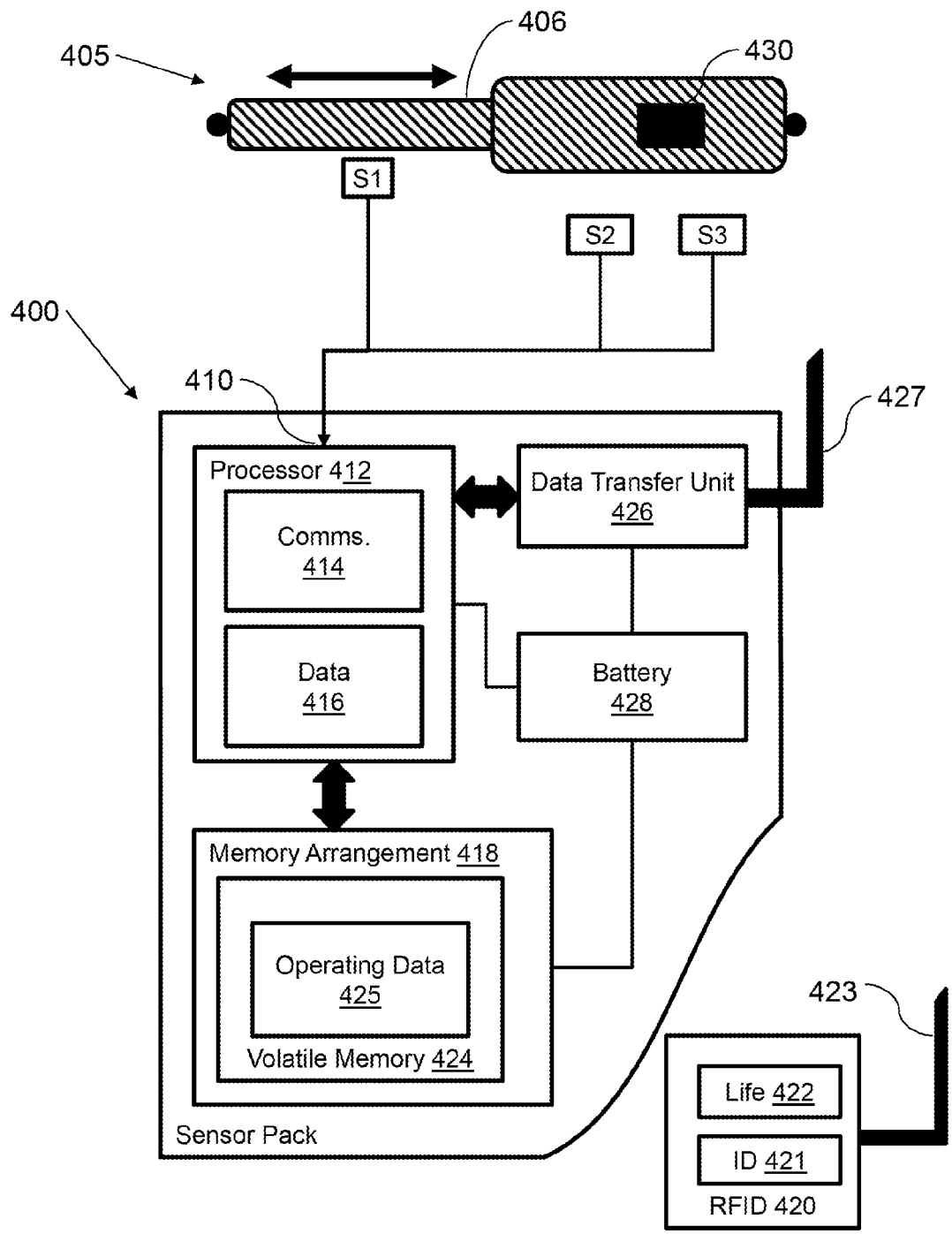
FIG. 4 is a schematic diagram of a component and sensing arrangement according to a fourth example herein.

A variation to the sensor pack of FIG. 3 is illustrated in the FIG. 4. In this instance, an RFID memory element 420 is separate from the main body of the sensor pack, such that the arrangement is distributed. Such an arrangement may be beneficial if, for example, it is desirable to attach the main body of the sensor pack in a relatively safer area (for example within a closable bay), while the RFID memory element 420 may be mounted in a more readily-accessible location (for example, external of the closable bay). This may facilitate ease of reading and writing to the RFID memory element 420 by a handheld, proximity RFID reading/writing device, for example.

Figure 5:
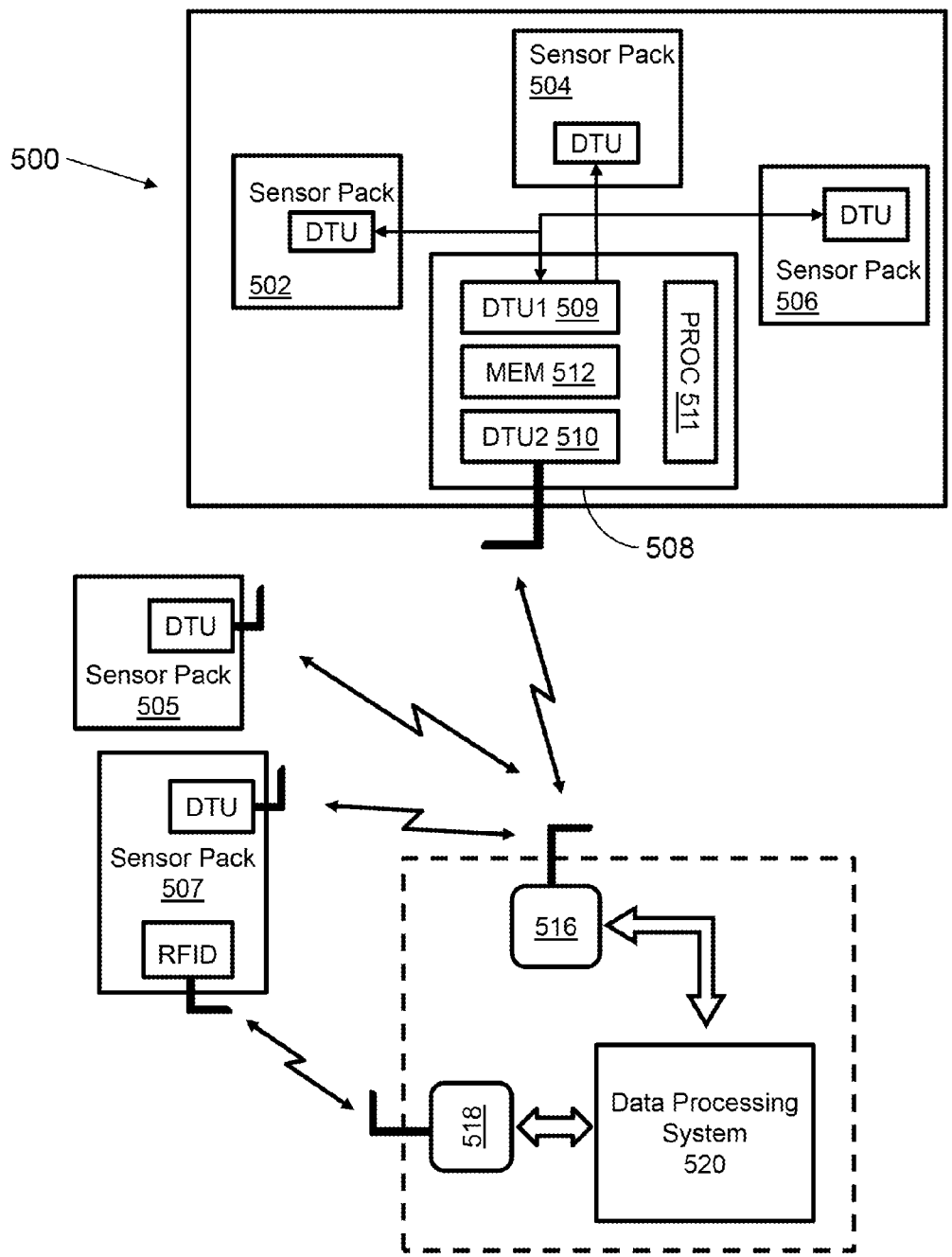
FIG. 5 is a schematic diagram of a multiple component and sensing arrangement according to an example herein.

FIG. 5 illustrates a system 500 comprising three sensor packs 502, 504, 506, each communicatively coupled via respective DTUs to a remote device 508 comprising a hub device. Each of the three sensor packs is shown electrically coupled to the hub device via wires, although other wired, optical or wireless links could be deployed. In one example, the frequency band of the wireless communication is between 4.2 GHz and 4.4 GHz as specified for aircrafts by the ITU. Aside from the illustrated 'wired' manner of connection to the hub device 408, the three sensor packs are, for example, of the first kind as illustrated in FIG. 1. The hub device 508 is communicatively coupled in turn, via a wireless link, to a further remote device 516 acting as a destination device.

The hub device 508 comprises a first DTU, DTU1 509, for communications with the individual sensor packs, and a second DTU, DTU2 510, for communications with the destination device. Each DTU, DTU1 and DTU2, supports two-way communications with the sensor packs and the destination device. The hub device 508 comprises in addition a processor 511, to control, the operation of the hub device 508, and a memory 512 for storing data, for example, for storing sensor data temporarily as it is passed from the sensor packs to the destination device 516. In another example, the memory of the hub device may be large enough to store more significant amounts of sensor data for longer periods, for example determined by anticipated monitoring interval duration. In such an example, the hub device may act as a main store for sampled and/or conditioned sensor data, which may lead to reduced memory overheads in individual sensor packs.

The destination device 516 is communicatively coupled, wirelessly, in addition, to a fourth sensor pack 505, which is generally of the second kind, as illustrated in FIG. 2. The destination device is communicatively coupled, wirelessly, in addition, to a fifth sensor pack 507, which is generally of the third kind, as illustrated in FIG. 3 or in FIG. 4.

The destination device 516 may be a programmable handheld computing device of known kind, such as a tablet computing device or a laptop personal computer, which is adapted for operation as will be described. The destination device is also arranged to communicate with a data processing system 520.

Also shown in FIG. 5 is a remote device 518 comprising an RFID device, which is arranged to communicate with respective RFID memory elements of sensor packs that include them. The RFID device 518 may also be a programmable handheld computing device of known kind, such as a tablet computing device, or a laptop personal computer, which is adapted for operation as will be described. The RFID device 518 is also arranged to communicate with the data processing system 520.

In some examples, the destination device 516 and the RFID device 518 may be embodied as the same device or apparatus, which is equipped with both wireless (for example WiFi® or Bluetooth®) and RFID communications capabilities.

The destination device 516 and the RFID device 518, individually or operating as parts of the same device or apparatus, may communicate with the data processing system via a wired, wireless or an optical connection, or via any other convenient data transfer means, including via out-of-band means such as via e-mail or via other messaging protocols such as SMS.

Figure 6:
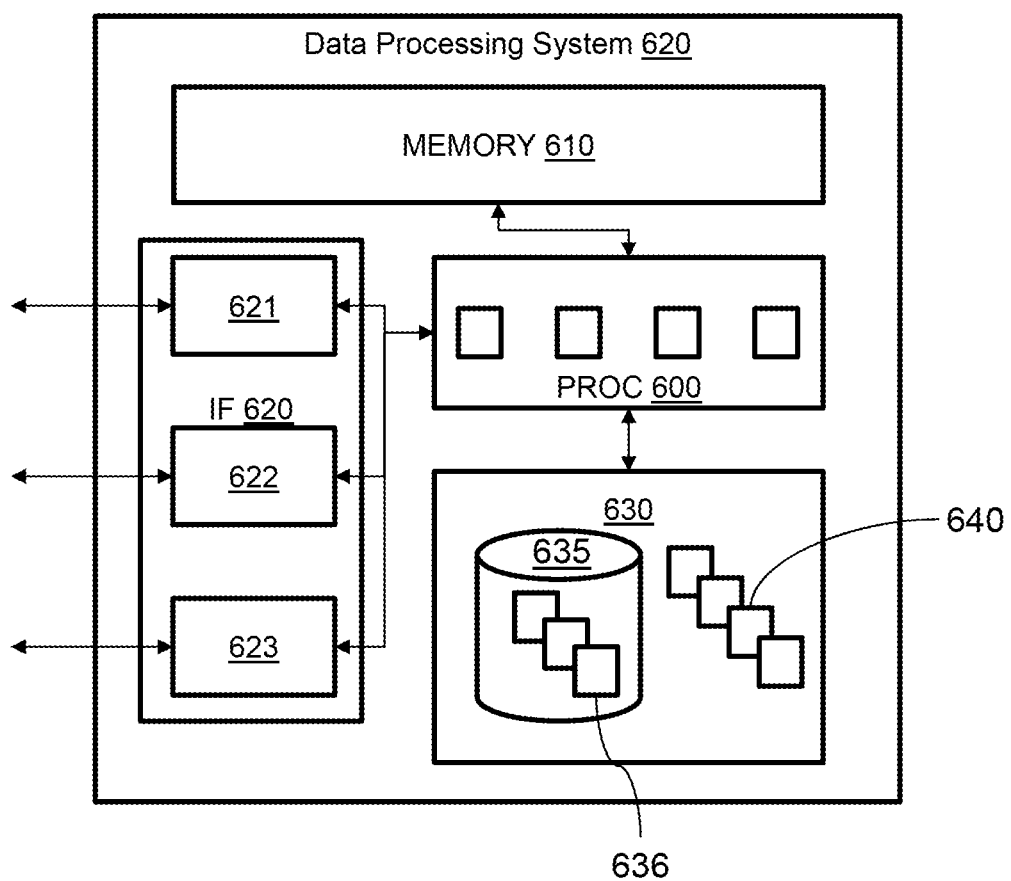
FIG. 6 is a schematic diagram of a data processing system for determining component life parameters according to an example herein.

FIG. 6 illustrates the data processing system 520 in more detail. The data processing system comprises main components such as a main processor 600, main memory 610, an interface unit 620 comprising different kinds of interface 621-623 for communicating with external devices, such as the destination device 516 and the RFID device 518, and a non-volatile storage unit 630, such as a hard disk drive, for storing a component usage database 635 and component usage models 640.

The component usage database 635 in the present example contains a component entry 636 for each component that has a sensor associated with it. The component entry 636 contains respective component life tracking data and a Total Life Consumed, $T_{CL}$, record.

Figure 7:
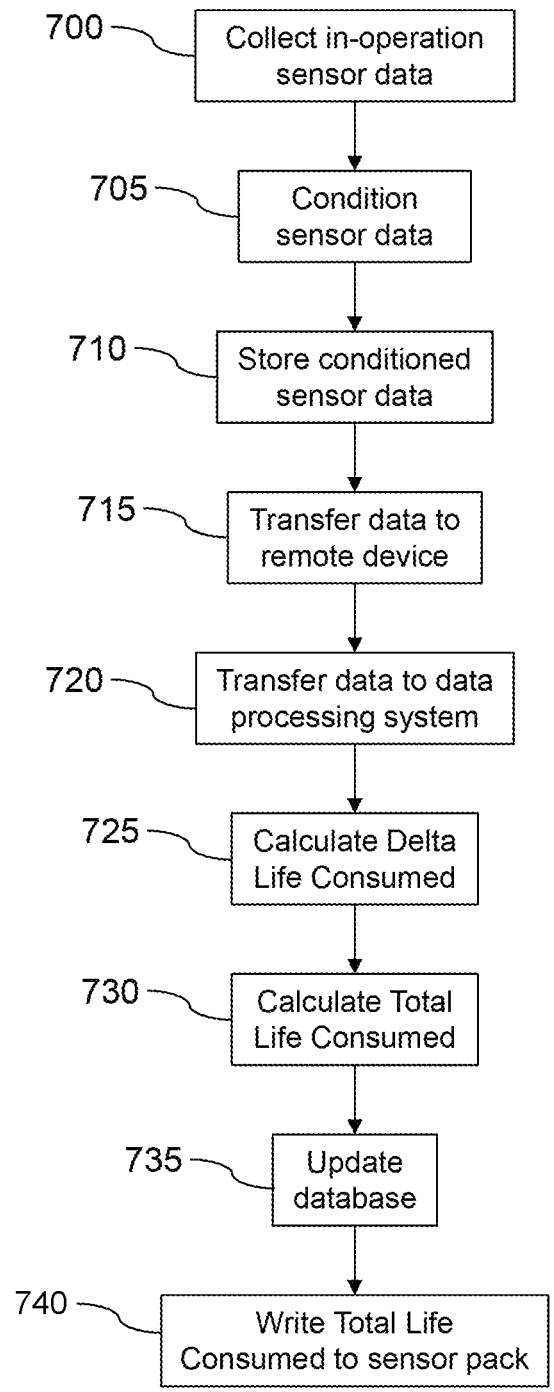
FIG. 7 is a flow diagram illustrating a process for determining and deploying component life parameters according to an example herein.

One example of the operation of a sensor pack, for example a sensor pack 100, and a data processing system 520 of the kind that are described herein will now be described with reference to the flow diagram in FIG. 7.

In a first step 700, data is captured by one or more sensors S1-S4. The kind of sensor or sensors that are present is or are determined by the component 105 that is being monitored and the data that usefully may be captured to provide indications of the operating behaviour of the component 105.

In a next step 705, the sensor data is conditioned, for example to reduce the amount of data that needs to be stored, and is then stored in a step 710. This process continues during the monitoring interval. The monitoring interval may take place over hours or even days, and the nature and anticipated duration typically inform how much sensor data is likely to be captured, how large respective memory 118 demands are and, also, for example, the nature and/or capacity of the power cell 128.

Periodically, in a next step 715, for example when a vehicle carrying the sensor pack 100 returns to a home destination or to another destination that is equipped interact with the systems herein, the stored sensor data is transferred to a remote device, for example, a destination device 516, either directly or via a hub device 508. The destination device 516 may initiate the data transfer by issuing an appropriate trigger, for example a trigger message, which may be detected directly by a sensor pack or indirectly by a sensor pack via a hub device or the like. In one example, an appropriate trigger message includes an identifier 121 of a sensor pack 100 (or of a hub device which is connected to one or more sensor packs). In this way, sensor packs are arranged only to react when specifically identified in a trigger message.

Other kinds of trigger may be employed. For instance, another trigger may be when an aircraft enters a hangar or maintenance area. In such a case, the sensor pack may be arranged to detect its location, for example by detecting its geographic location (for example by using a GPS or other location-determining device) or by detecting a location signal or signature emitted by devices at the location. Then, the sensor pack may be arranged to initiate data transfer without receiving a trigger message, which requests the transfer, as such. The stored sensor data may be transferred to the remote device over a wireless network operating at a frequency band of between 4.2 GHz and 4.4 GHz as specified for aircrafts by the ITU.

The remote device 516 is then arranged to communicate the sensor data to the data processing system 520 in a next step 720. The sensor data, again, can be communicated to the data processing system 520 in any appropriate manner.

The data processing system 520 uses the sensor data to determine a measure associated with the operating life of the component in a next step 725. The measure may, for example, relate to the life consumed of the component or of the life remaining of the component. In the present example, the measure relates to life consumed during the monitoring interval and is referred to herein as Delta Life Consumed, $\Delta_{CL}$.

The data processing system 520 then accesses the component life tracking data, from the component entry in the component usage database 635, and calculates a new Total Life Consumed, $T_{CL}$, value using the newly-determined $\Delta_{CL}$ measure in a next step 730. The new value of the $T_{CL}$ is then stored to a respective component entry in the component usage database 635 in a step 735. Optionally, all or at least some of the sensor data that has been received and/or the $\Delta_{CL}$ value may be stored too, for example, to provide an auditable record or options for further data analysis relating to the performance of the component 100.

Once the new value of the $T_{CL}$ has been determined, the data processing system 520 is arranged to communicate the value back to either or both of the destination device 516 and/or the RFID device 518. The $T_{CL}$ value is then written back to the sensor pack 100 to be stored as a life value 122 in NV memory 120, in a final step 740, in an appropriate data packet (or packets). The data packet(s) may also contain a respective identifier 121 of the sensor pack 100 to ensure that the respective data is only stored by the intended sensor pack. In this way the life value 122 can be accessed at a later date independently of where the sensor pack 100 and respective component 105 reside.

Figure 8:
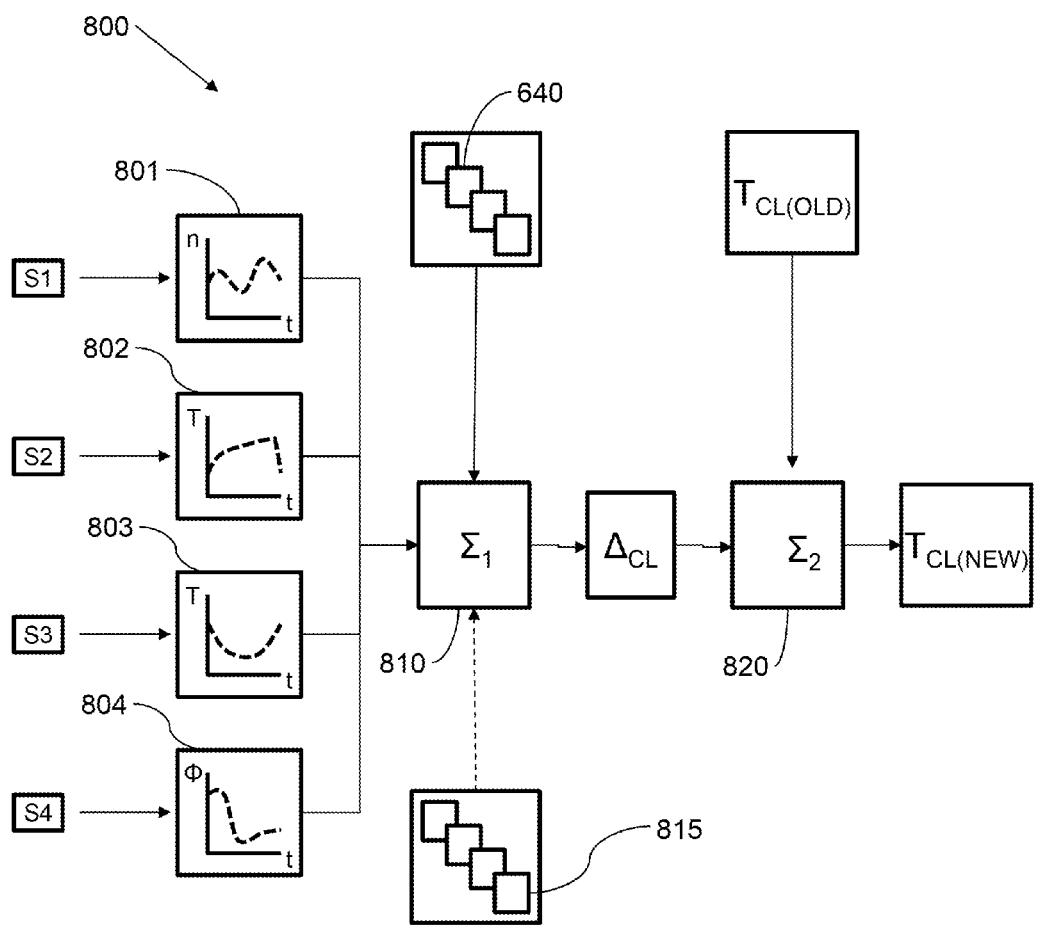
FIG. 8 is a schematic diagram of a processing flow used for determining component life parameters according to an example herein.

Ways in which the Delta Life Consumed measure, $\Delta_{CL}$, may be determined will now be described by way of example with reference to an exemplary processing system 800 as illustrated in FIG. 8. The processing system 800 depicts an example of how the data processing system 620 of FIG. 6 (and in particular the respective processor 600, memory 610 and storage 630) operates under the control of one or more computer programs to perform certain calculations. The arrangement receives as initial inputs sensor data that is collected from sensors such as sensors S1-S4, as outlined in FIG. 1, relating to a rotating part 106.

As depicted by the graph elements 801-804 in FIG. 8, each sensor (S1-S4) generates time-varying sensor data associated with the particular parameter that is being sensed. For example, sensor S1 generates rotation data in terms of rotations (n) per second, S2 and S3 generate time-varying temperature (T) data and sensor S4 generates time-varying relative humidity (Φ) data. Each of these parameters is useful independently for assessing performance of a rotating part.

In assessing component performance herein, each component considered is associated with at least one operational model 640, which may be derived at least initially from pre-deployment component testing and/or usage data. Each component may be associated with plural operational models. For example, the operational model(s) may be determined during initial life-testing of a component, before it is installed and used commercially. In laboratory conditions, for example, sample components may be tested to destruction in various ways. For a rotating part life testing may relate to how long a rotating part will perform for under varying conditions, such as varying rotation speeds, varying loads, varying temperatures, varying humidity, and the like. Many equivalent rotating parts may be tested many times by varying individual or plural operating parameters in order to ascertain one or more operating models 540 for the rotating part 105. The various models may then be updated over time as 'in operational use' data is collected, for example, over days months or years.

The operating model 640 for a rotating part may include conditions such as the following for data that is sensed and recorded:

an operating life of x hours given a recorded operating temperature range of a1-b1, a recorded operating relative humidity range of c1-d1 and recorded operating speeds of e1-f1;

the operating life is extended if the recorded temperature, humidity ranges are a2-b2 and c2-d2 respectively;

the operating life is reduced if the recorded temperature and humidity ranges are a3-b3 and c3-d3 respectively;

the operating life is reduced by w % if the recorded speeds increase by x % or is increased by y % if the recorded speeds decrease by z %.

There are various ways in which such operating models may be represented qualitatively or mathematically and such models may be simpler or far more complex depending on the nature of the respective component and its operating conditions.

According to the present example, the data processing system 510 substitutes-in the time-varying sensor data, which is received, into the respective model or models 640 and, by that means, under control of a first process $\Sigma_1$ 810 calculates the Delta Life Consumed, $\Delta_{CL}$, measure. Optionally, the first process $\Sigma_1$, in addition, receives external data 815, which is not directly related to the sensor data. The external data 815 may relate to absolutely anything that might influence the life parameter of a component, and which can be factored into the operating model(s) 640. External data 815 for an aircraft may, for example, comprise any one or more of: aircraft type, operating territory, prevailing weather, data from similar aircraft that have operated under similar conditions (historically or recently), aircraft operating company, aircraft laden weight, runway length and/or any other operating data, for example, extracted from an avionics system of a respective aircraft. Each of these kinds of data would have a bearing on the life parameter of a component; and the more data that is factored into the operating model the more accurate the life parameter is expected to be. Equivalent or similar external data can be determined for other types of vehicles.

A second process $\Sigma_2$ 820 uses $\Delta_C E$ and a most recent prior value of Total Life Consumed $T_{CL(OLD)}$ to calculate a new value of Total Life Consumed $T_{CL(NEW)}$, for example by adding $\Delta_{CL}$ to $T_{CL(OLD)}$. The value $T_{CL(NEW)}$ is treated as the current value and is written to the respective record in the component usage database 635 and then back to the sensor pack 100 (and any associated RFID element) of the respective component, as has been described.

While examples herein have focused on mechanical components in particular relating to aircraft and other vehicles it is emphasised that the principles apply equally to any other kind of component for which the determination of a life parameter may have practical use. Such components may be lugs or brackets, or other load-bearing parts, in aircrafts, for instance. Other examples include structural and/or load-bearing components in other structures and systems, which may undergo variable stresses and or loading when in-situ, and for which such stresses, loads, vibrations and the like experienced can be sensed and measured over time. Other measurable parameters include environmental, including atmospheric, electromagnetic or radiation levels, all of which can influence component life. The principles herein may then be deployed in order to determine component life parameters and facilitate, for example, a more accurate determination of an inspection interval and/or component maintenance and/or component replacement intervals.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A component package comprising:
    a component for use in a vehicle; and
    a component monitoring apparatus fixedly attached to the component, the component monitoring apparatus comprising:
        a sensor arrangement configured to generate sensor data;
        an input to receive the sensor data from the sensor arrangement, the sensor data being representative of use of the component during a monitoring interval;
        a non-transitory memory configured to store data representing the sensor data and a life parameter associated with the component;
        an interface to communicate with a remote device; and
        a power source to power the apparatus,
    wherein, the apparatus is arranged to:
    store, in the memory, the data representing the sensor data;
    in response to a trigger, read the data representing the sensor data from the memory and transfer the data representing the sensor data to the remote device; and
    in response to receipt of a data packet from the remote device containing the life parameter associated with the use of the component, store the life parameter to the memory.

2. The component package according to claim 1, wherein the memory comprises volatile memory to store sensor data.

3. The component package according to claim 1, wherein the memory comprises non-volatile memory to store the life parameter.

4. The component package according to claim 3, wherein the non-volatile memory comprises an RFID circuit and is readable from and/or writable to using RFID signals.

5. The component package according to claim 4, wherein the RFID circuit is powered by energy of the RFID signals.

6. The component package according to claim 1, wherein the component monitoring apparatus is arranged to condition the sensor data after receipt thereof to reduce a respective storage overhead of the data representing the received sensor data.

7. The component package according to claim 1, wherein the interface comprises a wireless interface for communicating wirelessly with remote devices.

8. The component package according to claim 7, wherein the wireless interface operates at a frequency of between 4.2 GHz and 4.4 GHz.

9. The component package according to claim 1, wherein the memory stores a unique identifier of the apparatus.

10. The component package according to claim 9, arranged to respond to a trigger that contains an identifier that matches the unique identifier of the apparatus.

11. The component package according to claim 1, wherein the vehicle is an aircraft.

12. The component package according to claim 1, wherein the component comprises a movable part, wherein the sensor arrangement is arranged to sense movement of the movable part during operation thereof and produce sensor data comprising movement data.

13. The component package according to claim 1, wherein the component comprises a rotatable part, wherein the sensor arrangement is arranged to sense rotation of the rotatable part during operation thereof and produce sensor data comprising rotation data.

14. The component package according to claim 1, wherein the sensor arrangement is arranged to sense at least one environmental parameter during operation of the component and produce environmental data.

15. The component package according to claim 1, wherein the sensor arrangement is arranged to sense at least one of: temperature, relative humidity, salinity, pH level and airborne particulate concentration.

16. A system for determining a component life parameter comprising:
an input configured to receive sensor data from the component monitoring apparatus of the component package according to claim 1;
a second non-transitory memory configured to store the data representing the sensor data received from the apparatus;
a processor configured to determine the life parameter using the data representing the sensor data received from the component monitoring apparatus and one or more respective component usage models; and
an output configured to return the life parameter to the component monitoring apparatus from which the data representing the sensor data was received.

17. The system according to claim 16, wherein the life parameter comprises a total life consumed measure.

18. The system according to claim 16, wherein the life parameter comprises life consumed during a monitoring interval.

19. The component package according to claim 12, wherein the vehicle is an aircraft.

20. A method comprising:
sensing, at a component monitoring apparatus that includes a sensor arrangement and that is fixedly attached to a component installed in a vehicle, at least one characteristic of the component, during a monitoring interval of the component, and producing sensor data representative of the at least one characteristic;
transmitting the sensor data to a remote device;
computing a life parameter of the component using the transmitted sensor data and at least one associated operating model;
storing the life parameter in a database record associated with the component;
receiving, at the component monitoring apparatus, the life parameter of the component; and
storing the life parameter to a memory of the component monitoring apparatus.

21. A component package comprising:
a component for use in an aircraft and that includes a rotatable part; and
a component monitoring apparatus fixedly attached to the component, the component monitoring apparatus comprising:
a sensor arrangement configured to sense rotation of the rotatable part during operation thereof and generate sensor data comprising rotation data;
an input to receive the sensor data from the sensor arrangement, the sensor data being representative of use of the component during a monitoring interval;
a non-transitory memory configured to store data representing the sensor data and a life parameter associated with the component;
an interface to communicate with a remote device; and
a power source to power the apparatus,
wherein, the apparatus is arranged to:
store, in the memory, the data representing the sensor data;
in response to a trigger, read the data representing the sensor data from the memory and transfer the data representing the sensor data to the remote device; and
in response to receipt of a data packet from the remote device containing the life parameter associated with the use of the component, store the life parameter to the memory.

* * * * *